(12) United States Patent  
Dvir et al.

(10) Patent No.: US 7,320,265 B2  
(45) Date of Patent: Jan. 22, 2008

(54) ARTICLE TRANSFER SYSTEM

(75) Inventors: Eran Dvir, Ramat Gan (IL); Beniamin Shulman, Rehovot (IL)

(73) Assignee: Nova Measuring Instruments Ltd., Rehovot (IL)

( * ) Notice: Subject to any disclaimer, the term of this patent is extended or adjusted under 35 U.S.C. 154(b) by 507 days.

(21) Appl. No.: 10/647,123

(22) Filed: Aug. 25, 2003

(65) Prior Publication Data

US 2004/0246012 A1 Dec. 9, 2004

(30) Foreign Application Priority Data

Jun. 5, 2003 (IL) ..................................... 156330

(51) Int. Cl.
*G05G 11/00* (2006.01)
(52) U.S. Cl. .................. 74/490.08; 74/490.09
(58) Field of Classification Search ............ 74/474.07, 74/474.08, 474.09, 471 XY, 490.03, 490.13, 74/490.01, 490.07–490.09, 17.8, 18, 18.2, 74/110; 269/73; 108/139, 141
See application file for complete search history.

(56) References Cited

U.S. PATENT DOCUMENTS

| 4,006,645 | A | * | 2/1977 | Newell | 74/490.08 |
| 5,150,040 | A | * | 9/1992 | Byrnes et al. | 324/758 |
| 5,157,871 | A | * | 10/1992 | Gawa et al. | 451/5 |
| 5,524,502 | A | * | 6/1996 | Osanai | 74/490.07 |
| 5,957,749 | A | | 9/1999 | Finarov | |
| 5,991,005 | A | * | 11/1999 | Horikawa et al. | 355/53 |
| 6,257,957 | B1 | * | 7/2001 | Murray et al. | 451/9 |
| 6,771,372 | B1 | | 8/2004 | Traber | |
| 6,917,420 | B2 | | 7/2005 | Traber | |
| 2004/0211285 | A1 | * | 10/2004 | Hunter | 74/490.08 |

OTHER PUBLICATIONS

U.S. Appl. No. 10/232,384, filed Sep. 3, 2002, Shulman et al.

* cited by examiner

*Primary Examiner*—Richard Ridley
*Assistant Examiner*—James Pilkington
(74) *Attorney, Agent, or Firm*—The Nath Law Group; Jerald L. Meyer; Matthew J. Moffa

(57) ABSTRACT

A system for controlling an axial movement of an article is presented. The system comprises a support stage assembly and a spring suspension arrangement mounted on the support stage assembly. The spring suspension arrangement comprises first and second assemblies arranged in a coaxial relationship one inside the other. The first assembly is attached to the support stage assembly. The second assembly serves for supporting an article-carrying member and is driven for movement along the axis with respect to the first assembly. The outer one of the first and second assemblies is configured to define two spaced-apart parallel planes perpendicular to said axis. The first and second assemblies are attached to each other by first and second membrane-like members arranged in a spaced-apart parallel relationship along said axis.

24 Claims, 5 Drawing Sheets

ARTICLE TRANSFER SYSTEM

FIELD OF THE INVENTION

This invention relates to an article transfer system, particularly useful in applications where precise positioning of an article with respect to a processing or metrology tool is required.

BACKGROUND OF THE INVENTION

Various applications, such as article inspection and measurements, as well as lithography processing, require precise movement of the article with respect to a processing tool along a vertical axis (Z-axis). For example, in the manufacture of semiconductor devices, as well as testing of circuits on semiconductor wafers, the wafer is typically supported on a stage mounted for a Z-axis movement (Z-stage) and sometimes also for rotation (Z/Theta stage).

U.S. Pat. No. 5,150,040 discloses a dual mode Z/Theta stage for supporting and moving a workpiece, such as a semiconductor wafer, for positioning during testing. The Z/Theta stage has a peripheral four-point elevator drive. The elevating suspension comprises parallel, vertically oriented, rigid lift pins, which bear the weight of a top-plate. The lift pins are located about the periphery of the stage to provide stability of the support. The top plate essentially floats on the lift pins so that virtually no frictional forces are translated to lift pins. The lift pins are elevated together by the force of four matched pin lift levers, crank arms. The crank arms are driven by downward force from a vertically translating air piston, which is in contact with the crank arms. The air piston provides a gentle force moderated by pneumatic pressure, which can moderate the full force of a stepping motor that drives it.

SUMMARY OF THE INVENTION

There is a need in the art to facilitate processing of articles by supporting an article on an article transfer system enabling precise movement of the article along a vertical axis. Here, the term "processing" signifies also measurement or inspection of articles.

The system of the present invention has a simple construction allowing precise movement of an article along a vertical axis (Z-axis) within a limited range of distances, and preferably also rotation of the article about the Z-axis.

The main idea of the present invention consists of utilizing a spring suspension arrangement for supporting an article-carrying member. The spring suspension arrangement is formed by two assemblies arranged in a coaxial relationship, one inside the other, wherein the outer assembly is configured to define two spaced-apart parallel planes perpendicular to the vertical axis. The arrangement is such that the first assembly is kept at a fixed position, and the second assembly, which is intended for supporting an article-carrying member, is driven for movement along a vertical axis with respect to the first assembly, while the assemblies are attached to each other by first and second membrane-like members arranged in a spaced-apart parallel relationship along the vertical axis. The vertical movement of the second assembly causes the deformation of the membrane-like members, thereby limiting the movement of the second assembly (and consequently the article-carrying member) by the deformability of membranes.

Thus, according to a broad aspect of the present invention, there is provided a system for controlling an axial movement of an article, the system comprising:

a support stage assembly;

a spring suspension arrangement mounted on said support stage assembly and comprising first and second assemblies arranged in a coaxial relationship one inside the other, the first assembly being attached to said support stage assembly and the second assembly serving for supporting an article-carrying member and being driven for movement along said axis with respect to the first assembly, the outer one of the first and second assemblies being configured to define two spaced-apart parallel planes perpendicular to said axis, said first and second assemblies being attached to each other by first and second membrane-like members arranged in a spaced-apart parallel relationship along said axis.

According to one embodiment of the invention, the outer assembly is composed of at least three spaced-apart pin-like members kept at a fixed position with respect to one another, and the inner assembly is composed of at least one pin-like member. According to another preferred embodiment of the invention, the outer and inner assemblies are configured as cylinders or prisms, of preferably substantially the same height. The inner assembly at its top and bottom is attached to the top and bottom of the outer assembly by said first and second membrane-like members, respectively. The membrane-like members are preferably of annular geometry, and may be clamped to the opposite sides of each of the outer and inner assemblies via clamping rings.

According to another aspect of the invention, there is provided a system for controlling movement of an article along at least a vertical axis, the system comprising:

a support stage assembly;

a spring suspension arrangement mounted on said support stage assembly and comprising first and second vertically oriented cylindrical assemblies arranged in a coaxial relationship one inside the other, the first assembly being attached to said support stage assembly and the second assembly serving for supporting an article-carrying member and being driven for movement along the vertical axis with respect to the first assembly, the inner cylindrical assembly at its top and bottom being attached to the top and bottom of the outer cylindrical assembly by, respectively, first and second membrane-like members thereby arranged in a spaced-apart parallel relationship along the vertical axis.

According to yet another aspect of the invention, there is provided a system for controlling movement of an article along at least a vertical axis, the system comprising:

a support stage assembly;

a spring suspension arrangement mounted on said support stage assembly and comprising first and second vertically oriented cylindrical assemblies arranged in a coaxial relationship one inside the other, the outer cylindrical assembly being attached to said support stage assembly and the inner cylindrical assembly serving for supporting an article-carrying member and being driven for movement along the vertical axis with respect to the outer assembly, the inner cylindrical assembly at its top and bottom being attached to the top and bottom of the outer cylindrical assembly by, respectively, first and second membrane-like members being thereby arranged in a spaced-apart parallel relationship along the vertical axis, a drive assembly associated with said inner cylindrical assembly and operable to provide said movement thereof.

The article-carrying member mounted on the second assembly may be driven for rotation with respect to said second assembly in a plane perpendicular to said axis of movement of the second assembly. The support stage assembly may be driven for movement in a plane perpendicular to said axis of movement of the second assembly. Considering a disk-like article, the support stage assembly is preferably movable along at least one perpendicular axis for a distance of at least a radius of the article The system may thus be operable as a Z-Theta-stage, R-Z-Theta-stage or X-Y-Z-Theta-stage.

Thus, according to yet another aspects of the invention, there are provided an R-Theta-Z system and an X-Y-Theta-Z system for controlling movement of an article including the above-described spring suspension arrangement.

The system of the present invention has a simple (and low cost) construction, which can be operable by a simple servo-control mechanism and provides for smoothness of the article movement with high precision. These features are of great importance for such applications as processing/inspection/measurements of semiconductor wafer structures. Generally, the system of the present invention can advantageously be used in optical measurements (precise focusing), electrical measurements (e.g., in four point probe measurements), near field measurements (e.g., eddy current based resistivity measurements), etc.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIG. 1A shows the system in an initial, non-deformed state of membranes of a spring suspension arrangement, and FIG. 1B shows the system in an operative state with the membranes being deformed.

DETAILED DESCRIPTION OF THE INVENTION

The present invention provides an article transfer and positioning system configured and operable to enable precise movement of the article along a vertical axis (Z-axis), and preferable also rotation about the Z-axis.

Figure 1A:
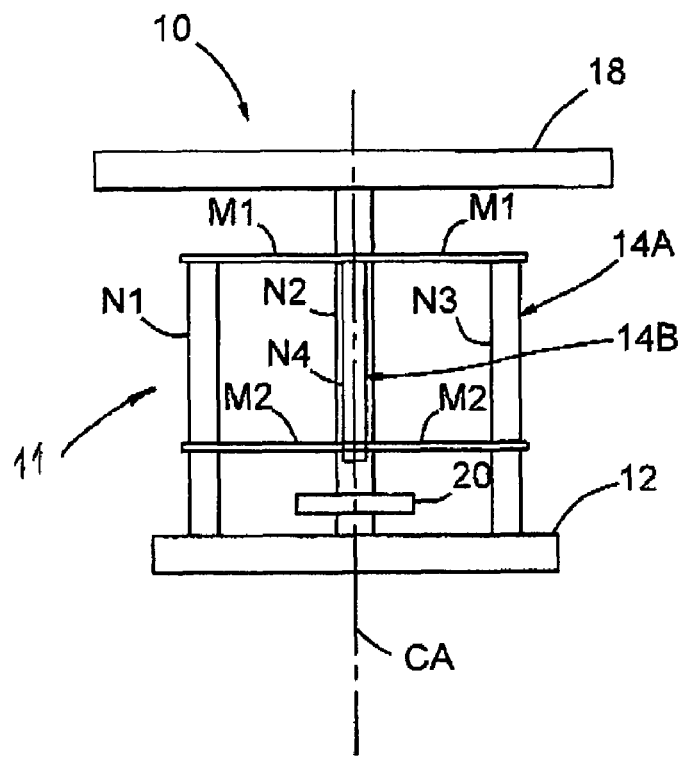
FIGS. 1A and 1B schematically illustrate the main constructional and operational principles of an article transfer and positioning system according to the invention, where
Figure 1B:
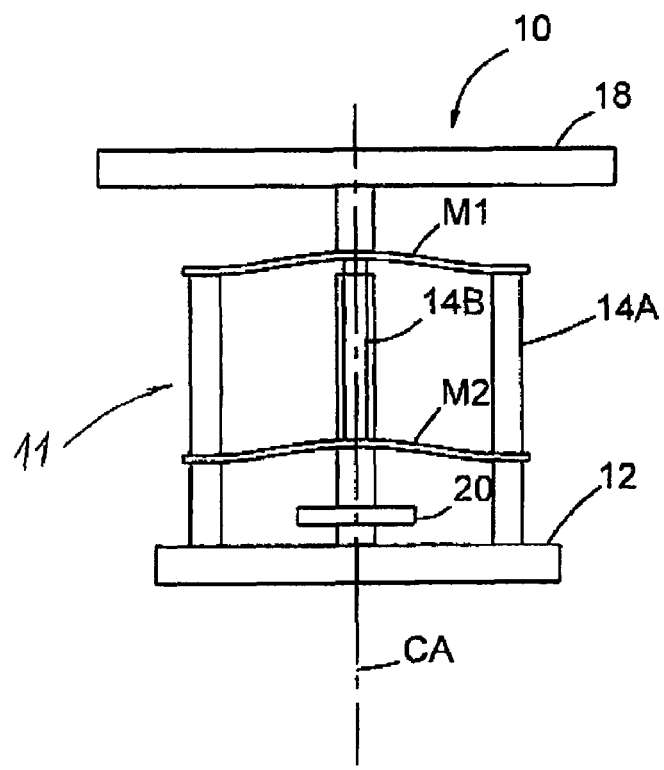

FIGS. 1A and 1B schematically illustrate the main constructional and operational principles of a system 10 according to the invention. The system 10 includes such main constructional parts as a support stage assembly 12 and a spring arrangement 11 mounted on the support stage assembly 12. The stage 12 may be driven for movement in a horizontal plane, presenting the so-called X-Y-stage or alternatively R-Theta stage.

The spring arrangement 11 includes inner and outer assemblies 14A and 14B, wherein one of these assemblies—the outer assembly 14A in the present example—is attached to the stage 12 and define upper and lower horizontal planes $P_1$ and $P_2$. The other assembly—inner assembly 14B in the present example—is attached to the assembly 14A in a manner to be vertically movable with respect to the assembly 14A within a limited range of distances. This is achieved by attaching the assemblies 14A and 14B to each other via two membrane-like members $M_1$ and $M_2$. Thus, driving of the inner assembly 14B for movement along the Z-axis would result in the simultaneous deformation of the membranes $M_1$ and $M_2$ (FIG. 1B), the limits of the Z-movement being defined by the deformability of the membranes and their dimensions. As shown in the figure in dashed lines, an article-carrying member 18 is mounted on the inner assembly 14B, and would thus be movable together with the assembly 14B. The membranes are preferably identical and are centered at the central axis CA of the inner assembly 14B.

It should be understood that, alternatively, the same effect could be achieved by attaching the inner assembly 14B to the stage 12, rather than the outer assembly 14A, and driving the outer assembly 14A for movement along the Z-axis in a similar manner.

Driving of the inner assembly 14B (or outer assembly, as the case may be) along the Z-axis can generally be achieved by associating this assembly with any suitable linear driver 20.

It should also be understood that, generally, in order to define the upper and lower planes for the membranes' location (in their non-deformable position), the outer assembly 14A can be formed by at least three spaced-apart members (e.g. rods or struts) $N_1$-$N_3$, preferably arranged so as to form a regular polygon (equilateral triangle in the present example) that are fixed to the stage 12 and are kept at a fixed position with respect to one another. As for the inner assembly, it may be in the form of a member (e.g. rod-shaped) $N_4$ located at the center of this polygon. Preferably, the assemblies 14A and 14B are configured as outer and inner prisms or cylinders.

Figure 2:
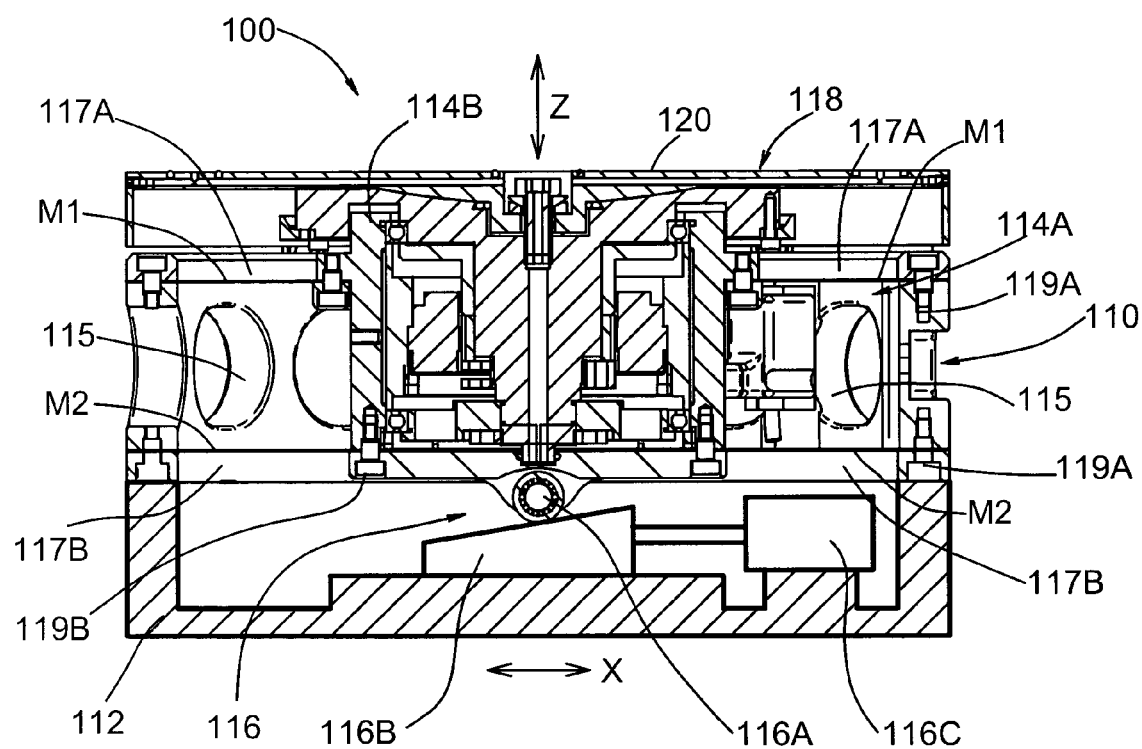
FIG. 2 exemplifies a specific implementation of the system of the present invention.

Referring to FIG. 2, there is illustrated a specific, but non-limiting, example of implementation of a system 100 according to the invention for use in transferring and positioning of articles. The system 100 is configured as a Z-stage, and preferably also as an R-Theta-stage. The system 100 comprises a spring suspension arrangement 110 mounted on a stage assembly 112. The stage 112 can be mounted for movement in a horizontal plane along one or two perpendicular axes (X-Y plane), i.e., presents an X-stage.

The spring arrangement 110 is formed by outer and inner cylinder-like assemblies (drums) 114A and 114B. The outer drum 114A is formed with openings, generally at 115, the provision of which is optional and is aimed at decreasing the weight of the entire construction and also at allowing access to the inner parts of the construction (e.g., for maintenance purposes). The drums 114A and 114B are attached to each other by top and bottom membrane-like members M.sub.1 and M.sub.2 (for example made of a stainless steel and having a thickness of 0.5 mm). The membranes M.sub.1 and M.sub.2 have an annular shape and are clamped to the drums by means of clamping rings 117A and 117B, respectively, and bolts 119A and 119B.

Further provided in the system 100 is a drive assembly 116 configured and operated for providing a movement of the drum 114B along the Z-axis. In the present example, the drive assembly 116 comprises a mechanical pair formed by a roller bearing 116A mounted on a central axis (shaft) CA of the inner drum 114B and a wedge element 116B supporting the bearing 116A on its inclined surface. A linear motor 116C is provided being connected to the wedge element 116B for moving it along the X-axis. Thus, when the wedge 116A is driven for a back and forward movement along the X-axis, the roller bearing 116B drives the inner assembly 114B for movement along the Z-axis. The inner drum 114B serves for supporting an article holding assembly 118. In the present example, where measurements/inspection/processing of semiconductor wafers is considered, the wafer supporting assembly 118 includes a chuck unit 120 preferably mounted for rotation in the horizontal plane. Considering rotation of the chuck carrying a disk-like article (e.g., semiconductor wafer), the stage 112 is movable along the X-axis within the range defined by the radius of the article (of at least the wafer's radius). The system 100 thus presents the Z-R-Theta stage. It should be understood that, generally, the system 100 might utilize X-Y-movement of the stage 112 with and without a rotation of the chuck unit 120.

Figure 3:
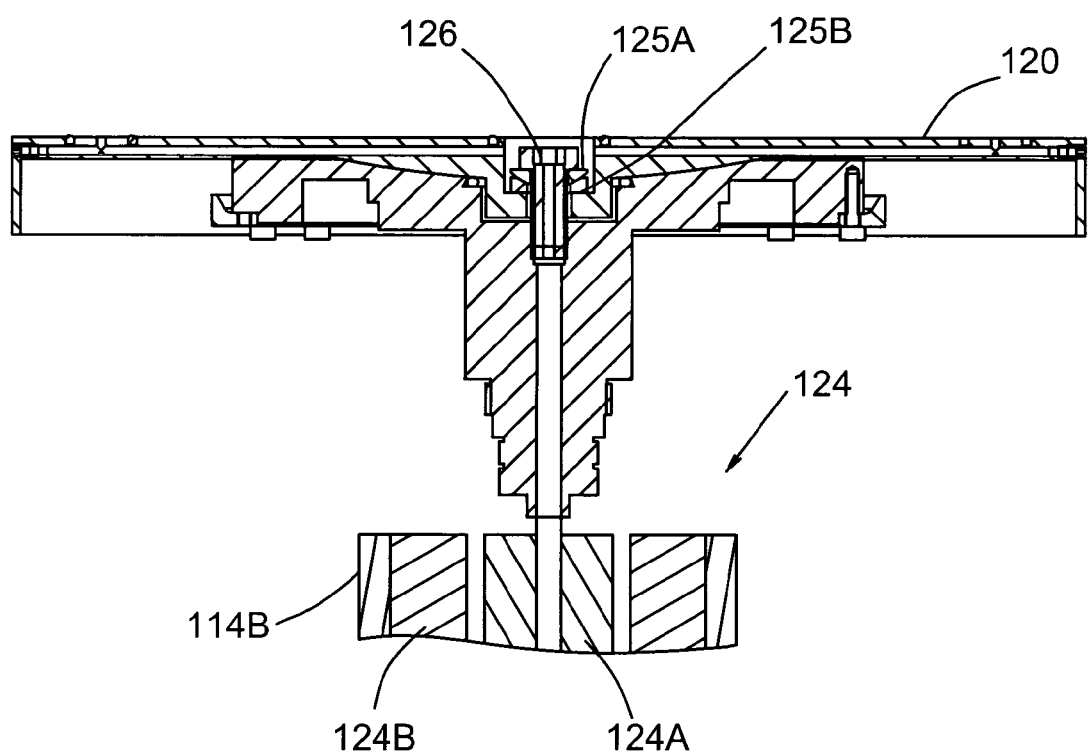
FIG. 3 more specifically illustrates a part of the system of FIG. 2 configured to provide rotation of an article supporting element about the Z-axis.

FIG. 3, which is a cross-sectional view of a part of the system 100, more specifically illustrates the chuck unit 120 mounted on the inner drum 114B. As shown, the chuck unit 120 is mounted on a rotor-part 124A of a motor 124, whose stator-part 124B is attached to the inner drum 114B. As further shown in FIGS. 2 and 3, the chuck unit 120 is mounted on a shaft of the rotor-part 124A via a pair of spherical washers 125A (male) and 125B (female) facing each other by their concave and convex surfaces and a bolt 126, e.g. spherical washers DIN 6319 commercially available from Ganter Griff. While mounting the chuck, its precise horizontal positioning can be regulated by displacing the washers with respect to each other.

Figure 4A:
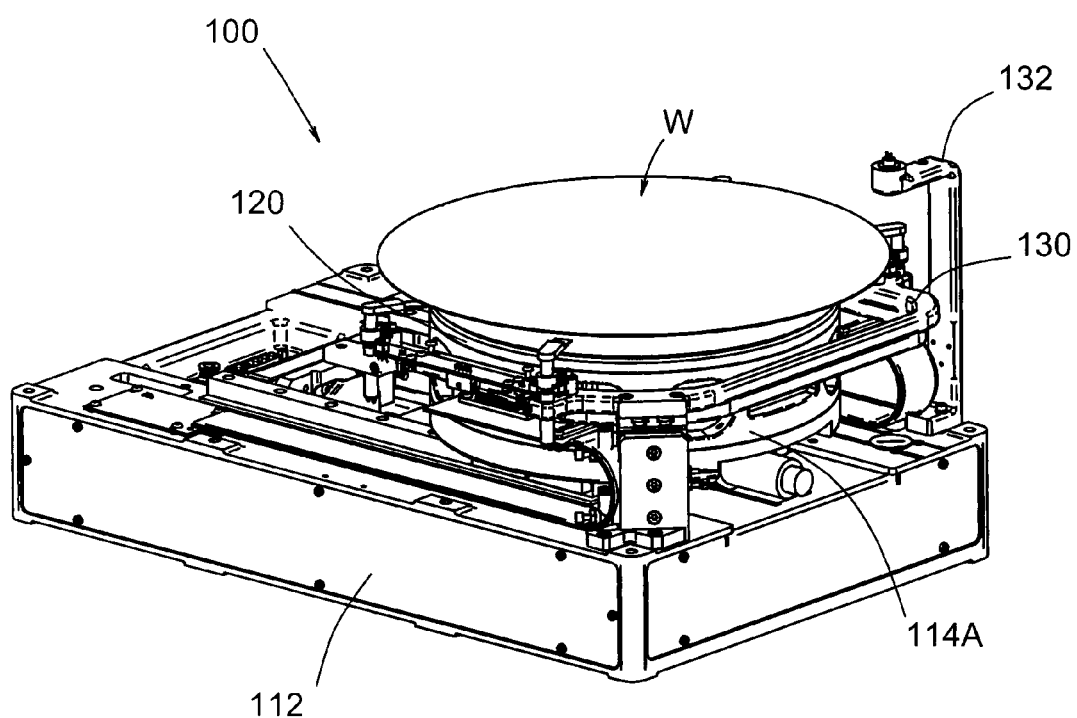
FIG. 4A schematically illustrates a Z-R-Theta-system of the present invention.
Figure 4B:
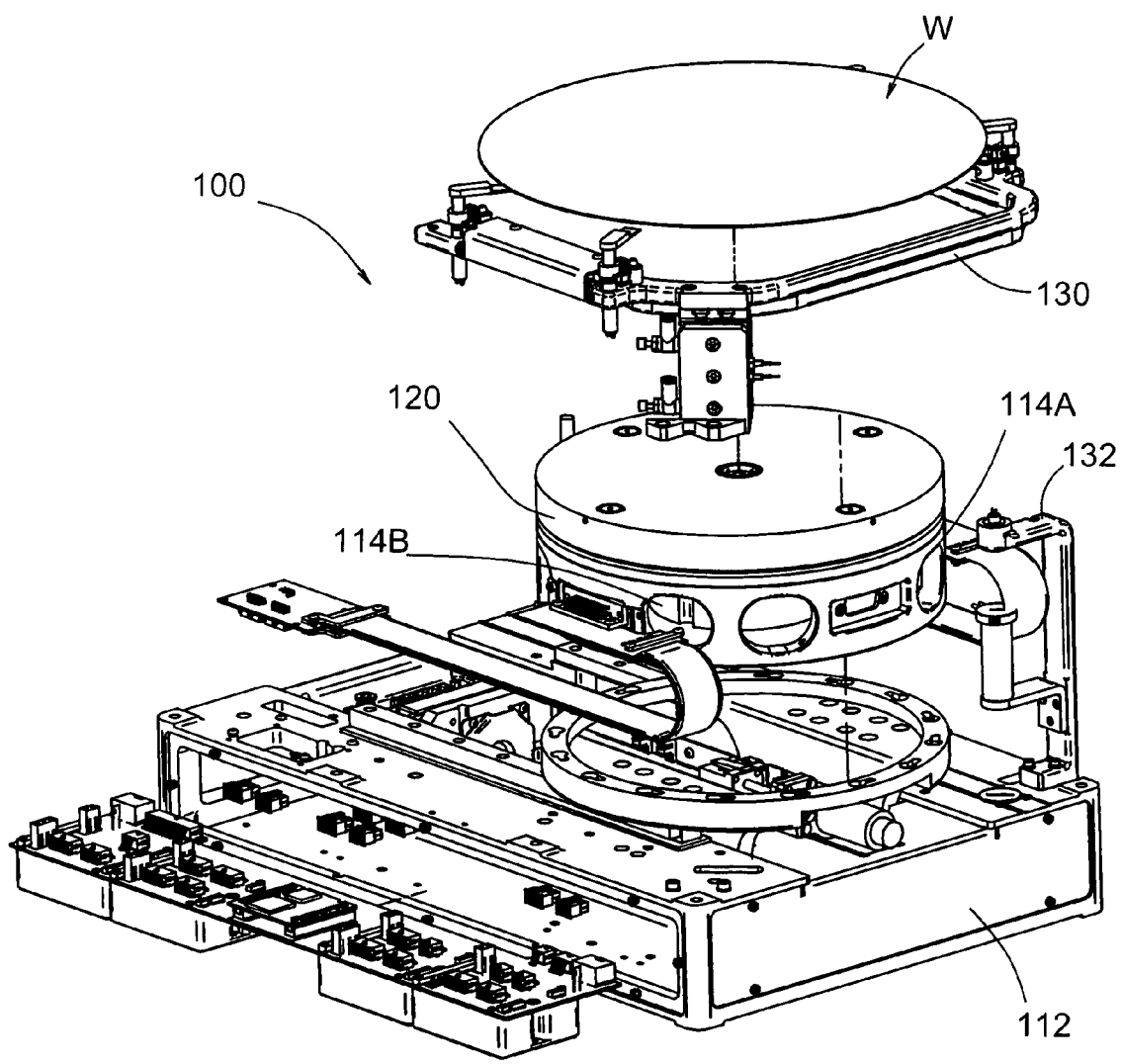
FIG. 4B shows an exploded view of the Z-R-Theta-system of FIG. 4A.

Reference is now made to FIGS. 4A and 4B showing the entire construction of the system 100 being used for supporting an article, e.g., wafer W (300 mm diameter). The configuration of the system 100 presents an accurate R-Theta-Z-system that can be operable as an integrated or stand-alone wafer stage platform. In the present example, the system 100 is used for auto-focusing purposes to control the wafer's in-focus position relative to an optical measuring module located above the wafer (not shown).

Wafer W is hold by a buffer unit (frame) 130. The construction and operation of the buffer unit 130 does not form a part of the present invention and therefore need not be specifically described. The preferred implementation of the buffer unit 130 is disclosed in co-pending U.S. application Ser. No. 10/232,384 assigned to the assignee of the present application. The buffer unit 130 is mounted on the stage 112 and associated with a drive mechanism (not shown) to be movable along the Z-axis with respect to the stage 112, and consequently with respect to the chuck unit 120, which is mounted on the inner drum 114B of the spring suspension arrangement. The chuck 120 is typically provided with openings for vacuum holding of the wafer. Considering the use of such a buffer unit for gripping and holding a wafer (load/unload station), the diameter of the chuck 120 is smaller than the diameter of the wafer. The chuck 120 is movable along the Z-axis (due to the movement of the drum of spring suspension arrangement) within a 1 mm-distance at a 0.1 μm precision, and is 360-degree rotatable. In the present example, also mounted on the stage 112 is an optical system 132 serving as the so-called "notch finder" for identifying a wafer located on the chuck and/or providing angular positioning of the wafer with respect to a processing tool (measurement, inspection, etc. tool).

Those skilled in the art will readily appreciate that various modifications and changes can be applied to the embodiments of the invention as hereinbefore described without departing from its scope as defined in and by the appended claims.

The invention claimed is:

1. A system for controlling a movement of an article, the system comprising:
    a support stage assembly;
    a spring suspension arrangement mounted on said support stage assembly and comprising first and second assemblies arranged in a coaxial relationship with respect to the axis of the article movement, and one inside the other, the first assembly being attached to said support stage assembly and the second assembly serving for supporting an article-carrying member and being driven for a movement along said axis of the article movement with respect to the first assembly, the outer one of the first and second assemblies being configured to define two spaced-apart parallel planes perpendicular to said axis of the article movement, said first and second assemblies being attached to each other by first and second membrane members arranged in a spaced-apart parallel relationship along said axis of the article movement; and
    a motor operable for rotating said support stage assembly around said axis, said motor being located inside the inner one of said first and second assemblies.

2. The system of claim 1, comprising a drive assembly associated with said first assembly and operable to provide said movement thereof along said axis.

3. The system of claim 2, wherein said drive assembly comprises a mechanical pair formed by a roller bearing mounted on a tapered surface of a wedge element; and a motor operable for moving the wedge element along an axis perpendicular to said axis.

4. The system of claim 1, wherein said outer assembly is attached to the support stage assembly, and said inner assembly is driven for movement along said axis.

5. The system of claim 1, wherein said outer assembly is composed of at least three spaced-apart pin members kept at a fixed position with respect to one another, and said inner assembly is composed of at least one pin member.

6. The system of claim 5, wherein an arrangement of said at least three fixed members of the outer assembly defines a regular polygon, and the pin member of the inner assembly is located substantially at the center of said polygon.

7. The system of claim 1, wherein the outer and inner assemblies have the same height.

8. The system of claim 1, wherein said outer and inner assemblies are configured as cylinders or prisms.

9. The system of claim 8, wherein the inner assembly at its top and bottom portions is attached to the top and bottom portions of the outer assembly by said first and second membrane members, respectively.

10. The system of claim 9, wherein said membrane members have annular geometry.

11. The system of claim 9, wherein said membrane members are clamped to the opposite sides of each of the outer and inner assemblies via clamping rings.

12. The system of claim 8, wherein said inner assembly is driven for said movement with respect to the outer assembly, said outer assembly being attached to the support stage assembly.

13. The system of claim 1, comprising the article-carrying member mounted on the second assembly for rotation with respect to said second assembly, the system being thereby operable as a Z-Theta-system.

14. The system of claim 13, wherein said support stage assembly is driven for movement in a plane perpendicular to the Z-axis, the system being thereby operable as a Z-R-Theta-system.

15. The system of claim 14 for use in transfer and positioning of a disk article with respect to said axis, wherein the support stage assembly is movable along a perpendicular axis for a distance of at least a radius of the article.

16. The system of claim 1, wherein said support stage assembly is driven for movement in a plane perpendicular to said axis.

17. The system of claim 1, wherein the article-carrying member is mounted on a central axis of said second assembly by means of a pair of spherical washers facing each other by their male and female surfaces, respectively, thereby enabling precise positioning of the article-carrying member in a plane perpendicular to said axis.

18. A system for controlling movement of an article along a vertical axis and rotational movement of the article, the system comprising:
   a support stage assembly; and
   a spring suspension arrangement mounted on said support stage assembly and comprising first and second vertically oriented cylindrical assemblies arranged in a coaxial relationship one inside the other, the first assembly being attached to said support stage assembly and the second assembly serving for supporting an article-carrying member and being driven for movement along the vertical axis with respect to the first assembly, the inner cylindrical assembly at its top and bottom being attached to the top and bottom of the outer cylindrical assembly by, respectively, first and second membrane members thereby arranged in a spaced-apart parallel relationship along the vertical axis, and
   a motor operable for rotating the support stage assembly, said motor being located inside said inner assembly.

19. The system of claim 18, comprising a drive assembly associated with said second cylindrical assembly and operable to provide said movement thereof along the vertical axis.

20. The system of claim 18, wherein said support stage assembly is driven for movement along at least one horizontal axis.

21. The system of claim 18, comprising the article-carrying member mounted on said second cylindrical assembly and driven for rotation with respect to said first cylindrical assembly.

22. A system for controlling movement of an article along at least a vertical axis, the system comprising:
   a support stage assembly;
   a spring suspension arrangement mounted on said support stage assembly and comprising first and second vertically oriented cylindrical assemblies arranged in a coaxial relationship one inside the other, the outer cylindrical assembly being attached to said support stage assembly and the inner cylindrical assembly serving for supporting an article-carrying member and being driven for movement along the vertical axis with respect to the outer assembly, the inner cylindrical assembly at its top and bottom being attached to the top and bottom of the outer cylindrical assembly by, respectively, first and second membrane members being thereby arranged in a spaced-apart parallel relationship along the vertical axis;
   a drive assembly associated with said inner cylindrical assembly and operable to provide said vertical movement thereof; and
   a motor operable for rotating the support stage assembly, said motor being located inside said inner cylindrical assembly.

23. An R-Theta-Z system for controlling movement of an article along the Z-axis and in a horizontal plane, the system comprising:
   a support stage assembly driven for movement along a horizontal axis; and
   a spring suspension arrangement mounted on said support stage assembly and comprising first and second vertically oriented cylindrical assemblies arranged in a coaxial relationship one inside the other, the first assembly being attached to said support stage assembly, and the second assembly serving for supporting an article-carrying member and being driven for movement along the vertical axis with respect to the first assembly, said article-carrying member being driven for rotation in the horizontal plane, the inner cylindrical assembly at its top and bottom being attached to the top and bottom of the outer cylindrical assembly by, respectively, first and second membrane members thereby arranged in a spaced-apart parallel relationship along the vertical axis; and
   a motor operable for rotating the support stage assembly in the horizontal plane, said motor being located inside said inner assembly.

24. An X-Y-Theta-Z system for controlling movement of an article along the Z-axis and in the horizontal X-Y-plane, the system comprising:
   a support stage assembly driven for movement along X- and Y-axes; and
   a spring suspension arrangement mounted on said support stage assembly and comprising first and second vertically oriented cylindrical assemblies arranged in a coaxial relationship one inside the other, the first assembly being attached to said support stage assembly, and the second assembly serving for supporting an article-carrying member and being driven for movement along the vertical axis with respect to the first assembly, said article-carrying member being driven for rotation in the horizontal plane, the inner cylindrical assembly at its top and bottom being attached to the top and bottom of the outer cylindrical assembly by, respectively, first and second membrane members thereby arranged in a spaced-apart parallel relationship along the vertical axis; and
   a motor operable for rotating the support stage assembly in the horizontal X-Y-plane, said motor being located inside said inner assembly.

* * * * *